United States Patent [19]

Harford

[11] 4,344,043
[45] Aug. 10, 1982

[54] VARIABLE LOAD IMPEDANCE GAIN-CONTROLLED AMPLIFIER

[75] Inventor: Jack R. Harford, Flemington, N.J.

[73] Assignee: RCA Corporation, New York, N.Y.

[21] Appl. No.: 143,032

[22] Filed: Apr. 23, 1980

[51] Int. Cl.³ .............................................. H03F 3/45
[52] U.S. Cl. .................................................. 330/254
[58] Field of Search ............................... 330/254, 284

[56] References Cited

U.S. PATENT DOCUMENTS

| | | | |
|---|---|---|---|
| 3,191,070 | 6/1965 | Jones | 330/285 |
| 3,641,450 | 2/1972 | Lunn | 330/254 |
| 3,706,937 | 12/1972 | Hanna | 330/254 |
| 3,976,951 | 8/1976 | Ishigaki et al. | 357/34 X |
| 4,065,725 | 12/1977 | Lillis et al. | 330/254 |
| 4,131,809 | 12/1978 | Baars | 307/296 A |
| 4,134,078 | 1/1979 | Arai et al. | 330/254 |
| 4,255,716 | 3/1981 | Takada | 330/284 |
| 4,267,518 | 5/1981 | Davis | 330/254 |

FOREIGN PATENT DOCUMENTS

| | | |
|---|---|---|
| 52-58345 | 5/1977 | Japan ..... 330/254 |
| 1017759 | 1/1966 | United Kingdom . |
| 1178232 | 1/1970 | United Kingdom . |
| 1366271 | 9/1974 | United Kingdom . |
| 1459774 | 12/1976 | United Kingdom . |
| 1485905 | 9/1977 | United Kingdom . |
| 1506744 | 4/1978 | United Kingdom . |

OTHER PUBLICATIONS

Wang; Patrick, "The GaAs FET in Microwave Instrumentation", Nov. 1976, Hewlett-Packard Journal, vol. 28, No. 3, p. 23.

Turner; C. S., "Differential Amplifier Provides AGC Control", Electronic Design, Mar. 2, 1964, p. 63.

Primary Examiner—James B. Mullins
Assistant Examiner—Gene Wan
Attorney, Agent, or Firm—Paul J. Rasmussen; William H. Meagher; W. Brinton Yorks, Jr.

[57] ABSTRACT

A gain-controlled amplifier is provided having a broad range of gain control which is traversed by varying the collector impedance of a common emitter coupled amplifying transistor. The collector load impedance of the transistor includes a controlled resistance device having a base electrode coupled to the collector electrode of the amplifying transistor, an emitter electrode coupled to receive a variable gain controlling current and a collector electrode coupled to a point of reference potential. At signal frequencies, the base-to-emitter junction of the device acts as a resistance which varies inversely with the flow of gain controlling current through the collector-to-emitter path of the device. Varying the resistance of the base-to-emitter junction of the device varies the collector load impedance of the amplifying transistor, whereby the gain of the transistor is varied by changing its load line as a function of the A.C. resistivity of the device. The collector-to-emitter path of the device through which the gain controlling current flows is separate from the transistor biasing circuitry, and hence control of the device will not affect the D.C. biasing of the amplifying transistor.

16 Claims, 4 Drawing Figures

VARIABLE LOAD IMPEDANCE GAIN-CONTROLLED AMPLIFIER

This invention relates to transistor amplifier circuits and, more particularly, to a gain-controlled transistor amplifier circuit in which the gain is varied by varying the output impedance of the amplifier.

A gain-controlled amplifier, such as the intermediate frequency (I.F.) amplifier of a television receiver, should be capable of satisfying a wide variety of often conflicting performance requirements. For instance, the amplifier should operate linearly with a broad range of input signal levels. The range of gain control should be sufficiently wide so as to produce a constant level output signal for the full range of input signals. These two requirements are often in conflict, since a transistor amplifier will typically have a narrow range of D.C. biasing, over which its linear operation is optimized. As the transistor is gain-controlled, such as by increasing or reducing the emitter degeneration of the transistor, the D.C. biasing will change as the emitter impedance changes. The result of gain control may then tend to degrade the linear operation of the amplifier.

It may be possible in a particular amplifier to block the changing D.C. characteristics of the controlled emitter resistance in an emitter degeneration gain-controlled amplifier through the use of capacitive coupling. Alternatively, an offsetting current may be injected into the amplifier to compensate for these D.C. changes. The use of capacitive coupling is undesirable, however, since the capacitive reactance will introduce a frequency-dependent element into the amplifier, which may tend to limit the dynamic range of the amplifier. Moreover, the use of capacitors makes manufacture of the amplifier in integrated circuit form more complex, since the capacitors must often be added in discrete form. Current compensation schemes are also to be avoided, since they contribute additional complexity to the amplifier design, and additional noise to the output signal.

Signal-to-noise performance of the amplifier is also important, particularly during conditions of strong signal reception in a television receiver. Under weak signal conditions, both the tuner and the I.F. amplifier are operating in a high gain condition. In an emitter degeneration gain-controlled I.F. amplifier, emitter resistance, which is a noise generation source in the amplifier, is reduced to cause the amplifier to have a high gain. With the noise-generating resistance thus reduced, the I.F. amplifier will have satisfactory signal-to-noise performance. Moreover, under weak signal conditions, the tuner will usually be exhibiting gain on the order of 40 db. The tuner signal-to-noise ratio will then establish the signal-to-noise performance of the tuner-I.F. system.

However, as the strength of the received television signal increases, the gain of the I.F. amplifier will be reduced, as by increasing the emitter resistance of the amplifier, which increases emitter degeneration. The increasing emitter resistance increases the noise generation sources in the system, which degrades the I.F. signal-to-noise performance. As the received signal strength increases further, the tuner is gain-reduced, and a point can be reached at which the tuner signal-to-noise performance is dominated by the I.F. signal-to-noise performance. Thus it is desirable to design the I.F. amplifier so that it will exhibit optimum signal-to-noise performance under strong signal conditions, at which time the I.F. signal-to-noise performance establishes the signal-to-noise ratio for the tuner-I.F. system.

In accordance with the principles of the present invention, a gain controlled amplifier is provided having a broad range of gain control which is traversed by varying the collector impedance of a common emitter coupled amplifying transistor. The collector load impedance of the transistor includes a controlled resistance device having a base electrode coupled to the collector electrode of the amplifying transistor, an emitter electrode coupled to receive a variable gain controlling current and a collector electrode coupled to a point of reference potential. At signal frequencies, the base-to-emitter junction of the device acts as a resistance which varies inversely with the flow of gain controlling current through the collector-to-emitter path of the device. Varying the resistance of the base-to-emitter junction of the device varies the collector load impedance of the amplifying transistor, whereby the gain of the transistor is varied by changing its load line as a function of the A.C. resistivity of the device. The collector-to-emitter path of the device through which the gain controlling current flows is separate from the transistor biasing circuitry, and hence control of the device will not affect the D.C. biasing of the amplifying transistor. Under strong signal conditions, the controllable collector load impedance is reduced to a minimum value for maximum gain reduction, which minimizes the noise generator sources at the output of the amplifier.

The amplifying transistor of the gain-controlled amplifier will typically exhibit a certain amount of collector-base capacitance, which can adversely affect the performance of the amplifier when used as an I.F. amplifier in a television receiver. The I.F. amplifier in a television receiver is usually preceded by frequency-selective circuitry which shapes the I.F. passband. When the I.F. signals are coupled from this circuitry to the base of the amplifying transistor, the effective input capacitance, which is a function of the collector-base capacitance and the voltage gain of the amplifying transistor, will be seen at the output of the selectivity circuitry as a part of the input impedance of the amplifier. As the gain of the amplifier is increased, the apparent input capacitance increases, and this increased capacitance will detune the selectivity circuitry to a lower frequency. In the television receiver, this detuning will effectively tune the selectivity circuitry away from the picture carrier and toward the color carrier. This will effectively reduce the signal level and the signal-to-noise ratio of the video information. Thus, it is desirable to design the gain-controlled amplifier so that the input impedance of the amplifier remains constant over the full range of gain control.

In accordance with a further aspect of the present invention, the input of the amplifying transistor is buffered by the addition of an emitter-follower coupled transistor, which isolates the collector-base capacitance from the selectivity circuits. Alternatively, a further embodiment of the present invention is presented in which a second transistor is coupled in cascode with the amplifying transistor to stabilize the voltage gain and hence the collector-base capacitance of the amplifying transistor.

Figure 1:
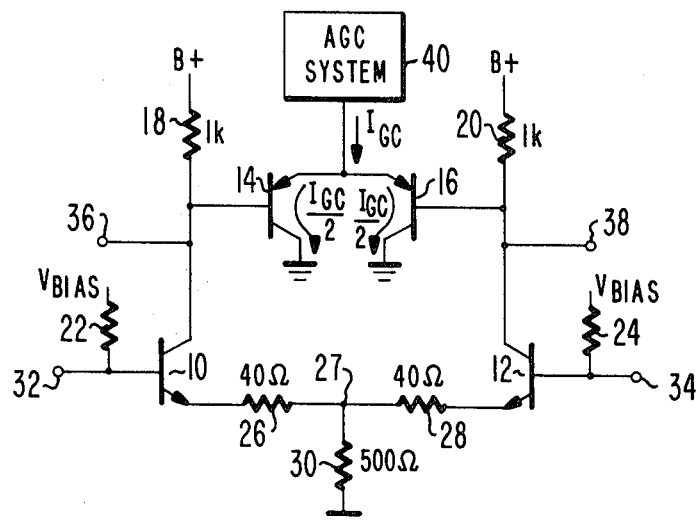
FIG. 1 illustrates, partially in schematic diagram form and partially in block diagram form, a differential gain-controlled amplifier constructed in accordance with the principles of the present invention.

Referring to FIG. 1, a gain-controlled differential amplifier is shown, including amplifying transistors 10 and 12. An input signal is applied between the base electrodes of the amplifying transistors at terminals 32 and 34, and the amplified output signal is derived between the collector electrodes of the two transistors at terminals 36 and 38. Base bias for transistors 10 and 12 is supplied by resistors 22 and 24, which are coupled between the respective base electrodes and a bias voltage source ($V_{BIAS}$). The emitters of the two amplifying transistors are coupled together by two resistors 26 and 28. A resistor 30 is coupled between the junction 27 of resistors 26 and 28 and a point of reference potential (ground).

Load resistors 18 and 20 are coupled between the respective collector electrodes of the amplifying transistors 10 and 12 and a source of supply voltage (B+). The collector electrodes of transistors 10 and 12 are also coupled to the base electrodes of controlled resistance devices 14 and 16, respectively. The controlled resistance devices have collector electrodes coupled to ground, and joined emitter electrodes. An AGC system 40 is coupled to the joined emitter electrodes of the controlled resistance devices and supplies gain control current $I_{GC}$ to the devices.

The controlled resistance devices 14 and 16 may be ordinary transistors and, in a preferred embodiment of the present invention, can operate in the same manner as the controlled resistance devices described in my U.S. patent application Ser. No. 143,022, entitled "GAIN-CONTROLLED AMPLIFIER USING A CONTROLLABLE ALTERNATING-CURRENT RESISTANCE", concurrently filed herewith. Briefly, the devices described in that application are constructed in a similar manner as vertical PNP transistors, with the base regions each comprising a region of substantially intrinsic (high resistivity) semiconductive material. This intrinsic region separates the P+ emitter region and an N+ base contact region by a distance which is greater than the diffusion length of minority carriers injected into the intrinsic region from the emitter region in response to the emitter-to-collector flow of gain controlling current $I_{GC}$. The emitter-base junction of the device thus acts as a nonrectifying PIN diode to high frequency (i.e., greater than one Megahertz) signals. The resistance of the emitter-base junction of the device is modulated by the flow of $I_{GC}$ current from the AGC system 40, and will decrease as the flow of $I_{GC}$ current increases. Substantially all of the $I_{GC}$ current flows in the emitter-to-collector path of the device, with only a small D.C. current flowing in the base of the device. This base current is insignificant by comparison with the emitter currents of transistors 10 and 12, and hence will not upset the D.C. biasing of the amplifying transistors 10 and 12.

In the arrangement of FIG. 1, the collector load impedance of each amplifying transistor comprises a resistor (illustratively shown as 1000 ohms) in parallel with the controlled base-to-emitter resistance of a controlled resistance device. The controlled resistance base-emitter junctions of the devices 14 and 16 are effectively in parallel with the fixed load resistances 18 and 20 because the joined emitters of devices 14 and 16 are at the center of the balanced amplifier configuration. Therefore, a signal null will result at this junction when input terminals 32 and 34 receive complementary push-pull signals. (The output of the AGC system may also be bypassed for signal frequencies.)

Amplifier gain control is achieved by varying current $I_{GC}$. When the gain control current $I_{GC}$ is varied to change the gain of the amplifier, the base-emitter resistance of the controlled resistance device varies, and the impedance of the parallel combination of the 1000 ohm load resistor and the varying resistance behaves as shown in Table I.

TABLE I

| Gain Reduction Range | $I_{GC}$, ma. | Load Impedance, Ω |
|---|---|---|
| Maximum Gain | 0.0 | 700 |
| ↓ | .03 | 400 |
| ↓ | .096 | 300 |
| ↓ | .2 | 207 |
| ↓ | .37 | 143 |
| ↓ | .59 | 104 |
| ↓ | .85 | 81 |
| Minimum Gain | 1.0 | 73 |

Figure 4:
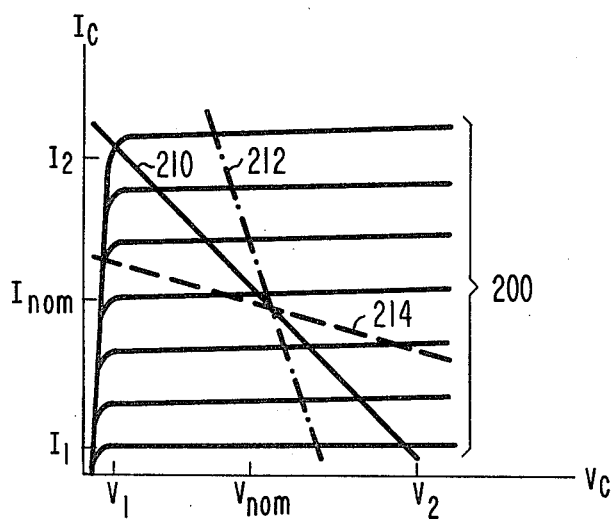
FIG. 4 illustrates the load line variation which achieves gain control in the amplifiers of FIGS. 1–3.

The variation in collector load impedance results in a variation in the load line of each amplifying transistor, as shown in FIG. 4. Dashed load line 214 represents a 700 Ω load line, and dashed and dotted line 212 represents a 73 Ω load line. A nominal 100 Ω load line is represented by solid load line 210. The load lines are superimposed over the characteristic curves of the amplifying transistor, enclosed in bracket 200. The load line variation from 700 ohms to 73 ohms provides approximately a 20 db range of gain control, as the voltage gain of the amplifying transistor is calculated as the product of the collector load impedance (load line) and the transconductance of the amplifying transistor:

$$V_{Gain} = Z_L g_m \quad (1)$$

In the technique of gain control illustrated in FIG. 1, it may be seen that the D.C. gain-control current $I_{GC}$ flows from the AGC system 40 to ground by splitting and flowing through the emitter-to-collector paths of the controlled resistance devices. Since only a very small base current component of this D.C. current flows to the collector electrodes of amplifying transistors 10 and 12, which is insignificant by comparison with the collector currents flowing through resistors 18 and 20, the D.C. biasing of the amplifying transistors remains substantially constant during gain control. This is especially advantageous when several amplifying stages are cascaded, since no D.C. shifts will be propagated from one stage to the next. Linear operation of the amplifier is enhanced, since the amplifier will not vary from its optimum D.C. operating point during any period of gain variation.

The gain-controlled amplifier of FIG. 1 provides enhanced signal-to-noise performance as compared to that of a conventional emitter-degeneration gain-controlled amplifier. As mentioned previously, signal-to-noise performance in a gain-controlled television I.F. amplifier is most important under strong signal (minimum gain) conditions, at which time the signal-to-noise performance of the tuner-I.F. amplifier combination is dominated by that of the I.F. amplifier. A common measure of the noise performance of an I.F. amplifier is the sizes of the resistances used, since resistors operate as noise generators in I.F. systems. In an emitter degeneration modulated amplifier, degeneration is reduced by increasing emitter resistance under strong signal conditions, which reduces the gain of the amplifier. This increase in resistance increases the noise generators in the amplifier at a time when signal-to-noise performance is most critical. But in the arrangement of FIG. 1, the collector load resistance is reduced to shift to a lower value load $Z_L$ under strong signal conditions, as shown in Table I. Thus, under strong signal conditions, the gain of the amplifier is reduced by decreasing the collector load resistance, which therefore reduces the noise generating resistance at the output of the amplifier. In this manner, signal-to-noise performance of the I.F. amplifier is improved at a time when I.F. signal-to-noise performance becomes most critical.

Since the D.C. biasing of the amplifier remains substantially constant, the amplifying transistors 10 and 12 can be D.C. biased to establish the desired range of gain control and signal handling characteristics of the amplifier. From equation (1), it is seen that gain is a function of $g_m$, which in turn is a function of collector current:

$$g_m = dIc/dV_{be} = (q/Kt)|I_c| \qquad (2)$$

where $|I_c|$ denotes the magnitude of the quiescent collector current. By choosing the resistors of the arrangement of FIG. 1 to have appropriate values, quiescent collector current, and hence the desired $g_m$, may be selected.

Signal handling capability is also a function of D.C. biasing. The amplifying transistors 10 and 12 are capable of linear operation for input signal levels up to approximately 13 millivolts, applied across their base-to-emitter junctions. By careful selection of base-emitter biasing and the emitter resistors 26 and 28, this 13 millivolt capability can be extended. The dynamic emitter resistance, $r_e$, of the amplifying transistors is a function of D.C. emitter current, varying, for example, from approximately 70 ohms (including contact resistance) at one-half milliamperes of emitter current, to approximately 20 ohms at three milliamperes. If the amplifying transistor is baised for an emitter current of approximately one milliampere, $r_e$ has a value of approximately 40 ohms, and the input signal applied to terminal 32 (or 34) is dropped across this resistance and the emitter resistor 26 (or 28). Since a complementary input signal is applied between terminals 32 and 34, the junction 27 of resistors 26 and 28 is at the center of a balanced configuration, resulting in a signal null at this point. With point 27 being a virtual signal ground point, the input signal is effectively dropped across each transistor $r_e$ and the emitter resistors 26 or 28, illustratively shown as 40 ohms. In this example, $r_e$ is approximately 40 ohms, and will handle 13 millivolts of input signal; hence, an additional 13 millivolts of signal will be dropped across the 40 ohm resistors 26 or 28. The amplifier is therefore capable of distortionless operation for input signals at each input terminal of up to 26 millivolts. By biasing the transistors 10 and 12 for different ratios of $r_e$ to emitter resistance, this capability may be extended or decreased as desired.

Figure 2:
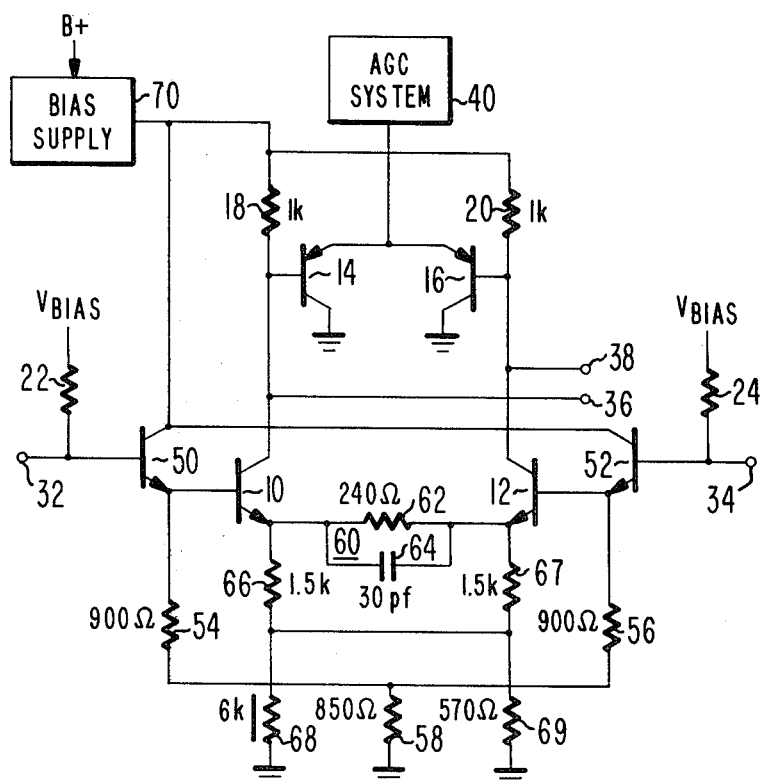
FIG. 2 illustrates, partially in schematic diagram form and partially in block diagram form, a second embodiment of the present invention which utilizes input buffering.

In the arrangement of FIG. 1, the collector-base capacitance or the amplifying transistors 10 and 12 can degrade the performance of the amplifier when used as an I.F. amplifying stage in a television receiver. Feedback due to this capacitance can reduce the gain of the amplifier, and the changing impedance at the input electrodes can detune the preceding selectivity circuits which are coupled to terminals 32 and 34. In the arrangement of FIG. 2, these effects of the collector-base capacitance are reduced, and additional features are presented. Components of FIG. 2 performing the same function as those in FIG. 1 bear the same reference numerals.

In the arrangement of FIG. 2, amplifying transistors 10 and 12 are buffered at their base inputs by emitter-follower coupled transistors 50 and 52. Terminal 32 and bias resistor 22 are coupled to the base of transistor 50, the emitter of which is coupled to the base of transistor 10 and a resistor 54. Terminal 34 and bias resistor 24 are coupled to the base of transistor 52, the emitter of which is coupled to the base of transistor 12 and to a resistor 56. Resistors 54 and 56 are joined together and are coupled to ground at their junction by a resistor 58.

The emitters of transistors 10 and 12 are joined together by the parallel combination 60 of a resistor 62 and a peaking capacitor 64, and by the series combination of resistors 66 and 67. The junction of resistors 66 and 67 is coupled to ground by the parallel combination of a pinch resistor 68 and a resistor 69.

The collectors of transistors 50 and 52 are coupled together, and receive supply voltage from a bias supply 70. The bias supply 70 also provides supply voltage for collector load resistors 18 and 20.

The effects of the collector-base capacitance of transistors 10 and 12 are present at the bases of these transistors. However, these effects are buffered from the input terminals 32 and 34 by the emitter-follower coupled transistors 50 and 52. The input impedance at the bases of transistors 50 and 52 remains substantially constant because the changing effect of the collector-base capacitance of transistors 10 and 12 during gain variation is effectively divided by the betas of the buffer transistors. The respective junctions of the emitters of transistors 50 and 52 and the bases of transistors 10 and 12 remain at a fixed D.C. bias level by virtue of the connection of bias resistors 54, 56 and 58.

The combination 60 provides a fixed emitter impedance for A.C. signals applied to the amplifying transistors, and also compensates for the effect of differing resistor values from circuit to circuit. Transistors 10 and 12 are biased so that each exhibits an $r_e$ of approximately 20 ohms. The parallel combination 60, using the component values illustratively shown in FIG. 2, has an impedance of approximately 120 ohms at the usual NTSC I.F. frequencies (approximately 50 MHz). Since the parallel combination 60 is coupled between the emitters of the balanced amplifier, a virtual signal null is effected at the center of the impedance, causing each amplifying transistor to effectively have a 60 ohm impedance between the transistor emitter and signal ground. Thus, each amplifying transistor can handle a 50 millivolt input signal without distortion, since 13 millivolts will drop across the 20 ohm $r_e$, and 39 millivolts will drop across the 60 ohm emitter impedance.

When the circuit of FIG. 2 is manufactured in quanity in integrated circuit form, the ratios of the resistor values of the circuit will tend to remain constant, but the absolute values of the respective resistors may vary from circuit to circuit. These variations will have little effect on the calculated result of the gain equation (1), since increases in the values of load resistors 18 and 20 will increase $Z_L$, but will also reduce collector current, which will reduce $g_m$, as seen in equation (2). Thus, changes in $g_m$ and $Z_L$ will tend to offset each other.

However, in order to minimize the power dissipation in the amplifier, the amplifier is conventionally operated at the knee of the upper end of the frequency versus gain curve of the amplifier. Increases in the resistor values in the amplifier have been found to cause the amplifier to roll off at lower frequencies, causing a reduction of as much as 3 db in amplifier gain at signal frequencies. The effect of capacitor 64 is to peak the response of the amplifier at its nominal operating frequency, which in this example is 50 MHz. If the value of resistor 62 is increased in a particular integrated circuit, the large value of the resistor is dominated by the relatively smaller reactive impedance of capacitor 64, which does not change significantly. The signal emitter impedances of transistors 10 and 12 thus remain in a fairly narrow range, thereby preventing any sizeable reduction of the emitter degeneration of the amplifier from circuit to circuit. Maintenance of the desired amount of emitter degeneration thus prevents significant decreases in amplifier gain from circuit to circuit.

The effect of the pinch resistor 68 is to compensate for beta ($\beta$) changes in the amplifier transistors from circuit to circuit. If the $\beta$'s of the circuit transistors are lower than desired in a particular integrated circuit, the base currents of the transistors will increase. In the case of transistors 50 and 52, the increasing base current will cause a larger than desired voltage drop across resistors 22 and 24 and hence lower base bias levels. The effect of the lower bias levels is to decrease the quiescent current conducted by transistors 10 and 12, resulting in an increase in the D.C. voltage levels at output terminals 36 and 38. When several stages are cascaded for increased amplification and gain control, the effects of these output voltage increases will upset the biasing of succeeding amplifier stages. However, pinch resistor 68 compensates for these $\beta$ differences, since its resistance varies as a function of the $\beta$ of the transistors of the circuit. If the $\beta$ of a particular circuit is low so as to cause the amplifying transistors to conduct a decreased amount of current, the value of the pinch resistor will also be low, which increases the current flow through transistors 10 and 12, thereby offsetting the $\beta$-induced decrease. In this manner, the biasing of the amplifier is stabilized against $\beta$ differences. The nominal value of pinch resistor 68 is chosen so that it, in combination with the parallel resistor 69, will provide the nominal desired emitter biasing for transistors 10 and 12.

The operation of the balance of the arrangement of FIG. 2 is essentially the same as that described in conjunction with FIG. 1.

Figure 3:
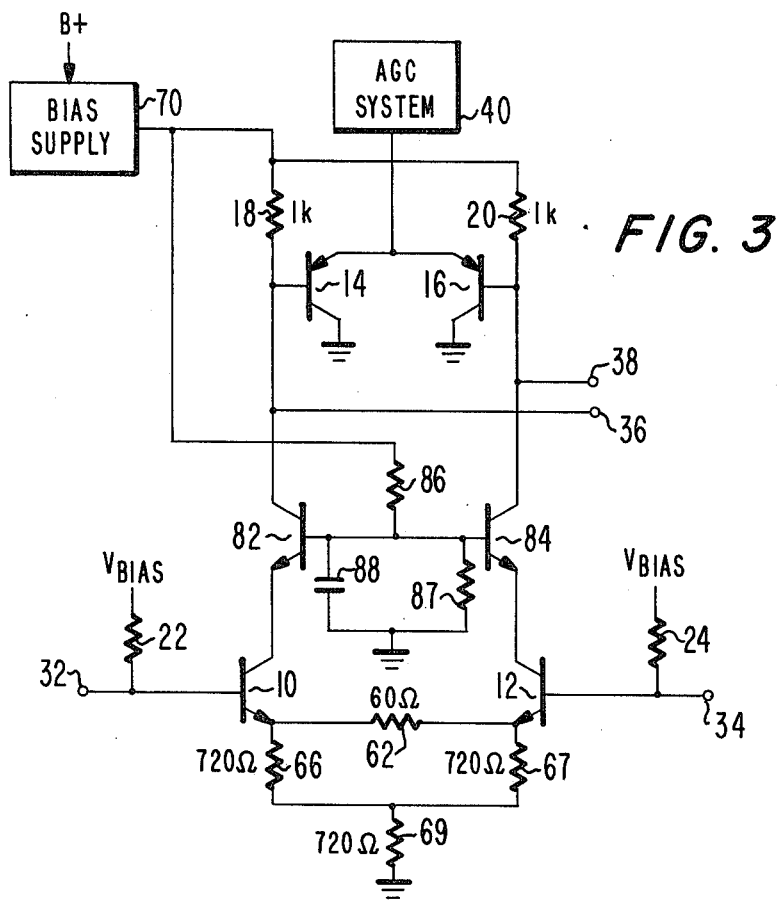
FIG. 3 illustrates partially in schematic diagram form and partially in block diagram form, a cascode amplifier constructed in accordance with the principles of the present invention.

An alternate embodiment which reduces the effects of collector-base capacitance is shown in FIG. 3, in which components functioning the same as those of FIG. 2 bear the same reference numerals. The arrangement of FIG. 3 includes cascoded outputs, having transistors 82 and 84 with emitter electrodes coupled to the collectors of transistors 10 and 12, respectively. The collector of transistor 82 is coupled to the base of controlled resistance device 14 and resistor 18 and the collector of transistor 84 is coupled to the base of controlled resistance device 16 and resistor 20. The bases of transistors 82 and 84 are connected together, and are bypassed for signal frequencies by a capacitor 88. A voltage divider, including serially-coupled resistors 86 and 87, is coupled between bias supply 70 and ground, and provides base bias for transistors 82 and 84 at the junction of the two resistors.

In the cascode configuration of FIG. 3, transistors 10 and 12 operate as current sources for the emitters of transistors 82 and 84. Signal voltage gain is provided by the upper cascode transistors 82 and 84, and the signal levels at the collectors of transistors 10 and 12 are small and essentially constant. Since the signal levels at the collectors of transistors 10 and 12 are essentially constant, no changing signal voltages are fed back from the collectors to the bases of transistors 10 and 12, which means that the input impedances at terminals 32 and 34 are substantially constant throughout the range of gain control. However, there will be effective variations of the collector-to-base feedback through the collector-base capacitances of transistors 82 and 84. But since the bases of transistors 82 and 84 are bypassed to ground for signal frequencies, this feedback will not affect the signal levels at the bases and the emitters of transistors 82 and 84, and hence will not affect the input impedance of the amplifier. The balance of the amplifier of FIG. 3 operates in a similar manner to the arrangements of FIGS. 1 and 2.

The embodiments shown may also be operated as modulators. For modulator operation, the AGC system 40 which supplies control current $I_{GC}$ is replaced by an amplifier which supplies a modulated current $I_{gc}$, which is representative of a modulating information signal. The resistance of the controlled resistance devices 14 and 16 is then varied as a function of this modulated current, which varies the gain of the amplifying transistors 10 and 12 (or the cascode-coupled transistors 10, 82 and 12, 84) as a function of the information of the modulated circuit. A carrier signal is applied between input terminals 32 and 34, thereby producing a carrier which is amplitude-modulated by the information of the modulated current between the output terminals 36 and 38.

What is claimed is:
1. A gain-controlled amplifier comprising:
  an amplifying transistor having a base electrode coupled to an input terminal, a collector electrode coupled to an output terminal, and an emitter electrode;
  means, coupled to said base, collector and emitter electrodes, for applying bias voltages to said electrodes;
  a source of gain controlling current; and
  means, having a first electrode coupled to said collector electrode, a second electrode coupled to a point of reference potential, and a third electrode coupled to said source of gain controlling current, and having a main current-conducting path between said second and third electrodes, the current conducted by said first electrode being substantially less than the current of said main current-conducting path when said main path is conductive, and responsive to said gain controlling current for developing a gain controlling resistance between said first and third electrodes which is a function of the magnitude of said gain controlling current and is applied to said collector electrode by said first electrode.

2. The gain-controlled amplifier of claim 1, wherein substantially all of said gain controlling current flows between said source and said point of reference potential through the path between said second and third electrodes of said variable resistance means, and substantially none of said gain controlling current flows through the path between said first and third electrodes of said variable resistance means.

3. The gain-controlled amplifier of claim 1, wherein the path of gain controlling current is substantially independent of said bias voltage applying means.

4. The gain-controlled amplifier of claims 1, 2, or 3, wherein said resistance developing means comprises a transistor, and said first electrode is a base electrode, said second electrode is a collector electrode, and said third electrode is an emitter electrode.

5. A gain-controlled differential amplifier, comprising:
first and second transistors, each having a base electrode coupled to an input terminal, a collector electrode coupled to an output terminal, and an emitter electrode;
a first resistance coupled between said emitter electrodes of said first and second transistors;
first and second resistors, each of which is coupled between a respective collector electrode of one of said first and second transistors and a source of supply potential;
means, coupled between said emitter electrodes of said transistors and a point of reference potential, for biasing said transistors;
a source of gain control current; and
first and second controlled resistance devices, each having a first electrode coupled to said source of gain control current, a second electrode coupled to a point of reference potential, and a third electrode coupled to a respective collector electrode of said first and second transistors, the current conducted by said third electrode being substantially less than the current conducted by said first or second electrodes when said devices are conducting current, and exhibiting a gain-controlling resistance between said first and third electrodes which is a function of the gain control current flow between said first and second electrodes and is applied to said collector electrodes by said respective third electrodes to control the gain of said differential amplifier.

6. The arrangement of claim 5, wherein said first resistance comprises third and fourth serially-coupled resistors, and said biasing means includes a fifth resistor coupled between the junction of said third and fourth resistors and a point of reference potential.

7. The arrangement of claims 5 or 6, wherein said first and second controlled resistance devices are transistors, and said first electrode is an emitter electrode, said second electrode is a collector electrode, and said third electrode is a base electrode.

8. In a television receiver, including an automatic gain control system which develops a control current for controlling the gain of an intermediate frequency amplifier, an intermediate frequency amplifier comprising:
first and second transistors, each having a base electrode coupled to an input terminal, a collector electrode coupled to an output terminal, and an emitter electrode;
a first resistance coupled between said emitter electrodes of said first and second transistors;
first and second resistors, each of which is coupled between a respective collector electrode of one of said first and second transistors and a source of supply potential;
means, coupled between said emitter electrodes of said transistors and a point of reference potential, for biasing said transistors; and
first and second controlled resistance devices, each having a first electrode coupled to said automatic gain control system, a second electrode coupled to a point of reference potential, and a third electrode coupled to a respective collector electrode of said first and second transistors, the current conducted by said third electrode being substantially less than the current conducted by said first or second electrodes when said devices are conducting current, and exhibiting a gain-controlling resistance between said first and third electrodes which is a function of the gain control current flow between said first and second electrodes and is applied to said collector electrodes by said respective third electrodes to control the gain of said intermediate frequency amplifier.

9. The arrangement of claim 8, wherein said biasing means comprises third and fourth resistors serially coupled between said emitter electrodes of said first and second transistors, and a fifth resistor coupled between the junction of said third and fourth resistors and a point of reference potential.

10. The arrangement of claim 8, wherein said first and second controlled resistance devices are transistors, and said first electrode is an emitter electrode, said second electrode is a collector electrode, and said third electrode is a base electrode.

11. The arrangement of claims 5, 8, or 10, further comprising third and fourth transistors, each having a base electrode coupled to one of said input terminals, an emitter electrode coupled to respective base electrodes of said first and second transistors, and a collector electrode coupled to a source of supply potential.

12. The arrangement of claims 5, or 8, further comprising a capacitor coupled in parallel with said first resistance.

13. The arrangement of claims 5, 8, or 10, further comprising third and fourth transistors, each having a collector-to-emitter path coupled between respective collector electrodes of said first and second transistors and said respective output terminals, and a base electrode coupled to receive a bias voltage and bypassed for A.C. signals, said first and second resistors being coupled between respective ones of said output terminals and said source of supply potential, and said third electrodes of said first and second controlled resistance devices being coupled to respective ones of said output terminals.

14. A modulator circuit comprising:
a source of signals to be modulated
first and second transistors, each having a base electrode coupled to said signal source, a collector electrode coupled to an output terminal, and an emitter electrode;
a resistance coupled between said emitter electrodes of said first and second transistors;
means, coupled between said emitter electrodes of said transistors and a point of reference potential, for biasing said transistors;
a source of modulating current; and
first and second controlled resistance devices, each having a first electrode coupled to said source of modulating current, a second electrode coupled to a point of reference potential, and a third electrode coupled to a respective collector electrode of said first and second transistors, the current conducted by said third electrode being substantially less than the current conducted by said first or second electrodes when said devices are conducting current, and exhibiting a modulating resistance between said first and third electrodes which is a function of the modulating current flow between said first and second electrodes and is applied to said collector electrodes by said respective third electrodes to modulate signals provided by said signal source.

15. The modulator circuit of claim 14, further comprising first and second resistors, each of which is coupled between a respective collector electrode of one of said first and second transistors and a source of supply potential, and wherein said first and second controlled resistance devices are transistors, and said first electrode is an emitter electrode, said second electrode is a collector electrode, and said third electrode is a base electrode.

16. A gain-controlled differential amplifier, comprising:

first and second differentially coupled transistors, each having a base electrode coupled to an input terminal, a collector electrode coupled to an output terminal, and an emitter electrode;

first and second resistors, each of which is coupled between a respective collector electrode of one of said first and second transistors and a source of supply potential;

means, coupled between said emitter electrodes of said transistors and a point of reference potential, for biasing said transistors;

a source of gain control current; and third and fourth transistors, each having an emitter electrode coupled to said source of gain control current, a collector electrode coupled to a point of reference potential, and a respective base electrode coupled to a respective collector electrode of said first and second transistors to present a gain-controlling impedance thereat, said third and fourth transistors exhibiting base-to-emitter impedances which are a function of the magnitudes of the gain control currents applied to said emitter electrodes of said third and fourth transistors.

* * * * *